United States Patent
Ishimaru (10) Patent No.: US 8,251,012 B2
(45) Date of Patent: Aug. 28, 2012

(54) SUBSTRATE PROCESSING APPARATUS AND SEMICONDUCTOR DEVICE PRODUCING METHOD

(75) Inventor: Nobuo Ishimaru, Takaoka (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 1142 days.

(21) Appl. No.: 11/885,483

(22) PCT Filed: Feb. 28, 2006

(86) PCT No.: PCT/JP2006/303731
§ 371 (c)(1),
(2), (4) Date: Apr. 7, 2008

(87) PCT Pub. No.: WO2006/093136
PCT Pub. Date: Sep. 8, 2006

(65) Prior Publication Data
US 2008/0286980 A1    Nov. 20, 2008

(30) Foreign Application Priority Data
Mar. 1, 2005    (JP) ................................. 2005-056314

(51) Int. Cl.
C23C 16/509    (2006.01)
C23C 16/505    (2006.01)
C23C 16/50    (2006.01)
C23C 16/455    (2006.01)
C23C 16/458    (2006.01)
C23F 1/00    (2006.01)
H01L 21/306    (2006.01)
C23C 16/06    (2006.01)
C23C 16/22    (2006.01)

(52) U.S. Cl. ........... 118/723 E; 118/723 ER; 118/723 I; 156/345.43; 156/345.44; 156/345.45; 156/345.46; 156/345.47; 156/345.48; 156/345.49

(58) Field of Classification Search ............... 118/723 E, 118/723 ER, 723 I; 156/345.43, 345.44, 156/345.45, 345.46, 345.47, 345.48, 345.49
See application file for complete search history.

(56) References Cited

U.S. PATENT DOCUMENTS

| 3,644,191 | A | * | 2/1972 | Matsushima | ............ 204/298.06 |
| 4,096,822 | A | * | 6/1978 | Yamawaki et al. | ........... 118/729 |
| 4,401,689 | A | * | 8/1983 | Ban | ............................ 427/589 |
| 4,499,853 | A | * | 2/1985 | Miller | ........................ 118/725 |
| 4,612,207 | A | * | 9/1986 | Jansen | ........................ 427/576 |
| 4,633,809 | A | * | 1/1987 | Hirose et al. | ................. 118/719 |

(Continued)

FOREIGN PATENT DOCUMENTS
JP    63190173 A    *    8/1988
(Continued)

*Primary Examiner* — Rudy Zervigon
(74) *Attorney, Agent, or Firm* — Birch, Stewart, Kolasch & Birch, LLP (57) ABSTRACT

Disclosed is a substrate processing apparatus, including: a processing container; a gas supply section to supply a desired processing gas to the processing container; a gas exhaust section to exhaust a surplus of the processing gas from the processing container; a substrate placing member to place a plurality of substrates thereon in a stacked state in the processing container; and an electrode, to which high frequency electric power is applied, to generate plasma for exciting the processing gas, the electrode including two thin and long linear sections disposed in parallel and a short-circuit section to electrically short-circuit one ends of the linear sections, and the linear sections extending beside the substrates in a direction substantially perpendicular to main faces of the substrates.

6 Claims, 12 Drawing Sheets

U.S. PATENT DOCUMENTS

| | | | | |
|---|---|---|---|---|
| 4,657,616 A * | 4/1987 | Benzing et al. | ............ | 156/345.43 |
| 4,747,368 A * | 5/1988 | Brien et al. | .................. | 118/715 |
| 4,854,266 A * | 8/1989 | Simson et al. | ................ | 118/728 |
| 5,052,339 A * | 10/1991 | Vakerlis et al. | ............ | 118/723 E |
| 5,217,560 A * | 6/1993 | Kurono et al. | ............ | 156/345.43 |
| 5,279,670 A * | 1/1994 | Watanabe et al. | ............ | 118/725 |
| 5,383,984 A * | 1/1995 | Shimada et al. | ......... | 156/345.26 |
| 5,558,719 A * | 9/1996 | Tsuchida et al. | .......... | 118/723 E |
| 5,567,243 A * | 10/1996 | Foster et al. | .................. | 118/730 |
| 5,618,349 A * | 4/1997 | Yuuki | ........................... | 118/715 |
| 5,647,912 A * | 7/1997 | Kaminishizono et al. | .... | 118/719 |
| 5,739,069 A * | 4/1998 | Usui et al. | ..................... | 438/710 |
| 5,770,098 A * | 6/1998 | Araki et al. | ..................... | 216/67 |
| 5,811,022 A * | 9/1998 | Savas et al. | ..................... | 216/68 |
| 5,925,188 A * | 7/1999 | Oh | ............................... | 118/715 |
| 5,950,925 A * | 9/1999 | Fukunaga et al. | ......... | 239/132.3 |
| 6,135,053 A * | 10/2000 | Okamura | ................. | 118/723 E |
| 6,140,773 A * | 10/2000 | Anders et al. | ............. | 315/111.21 |
| 6,143,129 A * | 11/2000 | Savas et al. | .............. | 156/345.48 |
| 6,145,469 A * | 11/2000 | Teranishi et al. | ......... | 118/723 E |
| 6,146,461 A * | 11/2000 | Yang et al. | ..................... | 118/715 |
| 6,181,069 B1 * | 1/2001 | Tonotani et al. | ......... | 315/111.51 |
| 6,237,526 B1 | 5/2001 | Brcka | | |
| 6,388,381 B2 * | 5/2002 | Anders | ................. | 315/111.21 |
| 6,402,849 B2 * | 6/2002 | Kwag et al. | .................. | 118/715 |
| 6,446,572 B1 * | 9/2002 | Brcka | ................. | 118/723 ER |
| 6,500,500 B1 * | 12/2002 | Okamura | ................... | 427/569 |
| 6,558,507 B1 * | 5/2003 | Teranishi et al. | ........ | 156/345.45 |
| 6,719,876 B1 * | 4/2004 | Ueda et al. | ............... | 156/345.48 |
| 7,047,903 B2 * | 5/2006 | Ito | ............................. | 118/723 I |
| 7,387,968 B2 * | 6/2008 | Joe | ................................ | 438/716 |
| 7,785,441 B2 * | 8/2010 | Miyake et al. | ............. | 156/345.48 |
| 7,892,611 B2 * | 2/2011 | Swallow et al. | ............. | 427/569 |
| 7,952,048 B2 * | 5/2011 | Choi et al. | ............... | 219/121.57 |
| 8,034,418 B2 * | 10/2011 | Ueda et al. | ................... | 427/569 |
| 2001/0025605 A1 * | 10/2001 | Nagakura | ................... | 118/715 |
| 2002/0033229 A1 * | 3/2002 | Lebouitz et al. | ............. | 156/345 |
| 2002/0124800 A1 * | 9/2002 | Moriyama | ................... | 118/715 |
| 2002/0153103 A1 * | 10/2002 | Madocks | ................. | 156/345.46 |
| 2003/0049372 A1 * | 3/2003 | Cook et al. | ................. | 427/248.1 |
| 2003/0164143 A1 * | 9/2003 | Toyoda et al. | ............ | 118/723 E |
| 2003/0183169 A1 * | 10/2003 | Ueda et al. | .................. | 118/723 I |
| 2004/0025786 A1 * | 2/2004 | Kontani et al. | ............... | 118/715 |
| 2004/0134429 A1 * | 7/2004 | Yamanaka et al. | ........ | 118/723 E |
| 2005/0287775 A1 * | 12/2005 | Hasebe et al. | ................ | 438/503 |
| 2006/0049138 A1 * | 3/2006 | Miyake et al. | ................. | 216/58 |
| 2006/0260544 A1 * | 11/2006 | Toyoda et al. | ................ | 118/715 |
| 2007/0234961 A1 * | 10/2007 | Takahashi et al. | ........ | 118/723 R |
| 2008/0066681 A1 * | 3/2008 | Toyoda et al. | ............ | 118/723 R |
| 2008/0121180 A1 * | 5/2008 | Kontani et al. | ........... | 118/723 R |
| 2008/0153308 A1 * | 6/2008 | Ogawa et al. | ................. | 438/758 |
| 2008/0251014 A1 * | 10/2008 | Kontani et al. | ............... | 118/715 |
| 2008/0251015 A1 * | 10/2008 | Kontani et al. | ............... | 118/715 |
| 2008/0286980 A1 * | 11/2008 | Ishimaru | ....................... | 438/716 |
| 2009/0071405 A1 * | 3/2009 | Miyashita et al. | ......... | 118/723 R |
| 2009/0074984 A1 * | 3/2009 | Shimizu et al. | ............... | 427/569 |
| 2009/0151632 A1 * | 6/2009 | Okuda et al. | ................. | 118/666 |
| 2009/0255468 A1 * | 10/2009 | Yamamoto et al. | ....... | 118/723 E |
| 2010/0130009 A1 * | 5/2010 | Ishimaru | ....................... | 438/680 |
| 2010/0263593 A1 * | 10/2010 | Kontani et al. | ........ | 118/723 HC |

FOREIGN PATENT DOCUMENTS

| | | | |
|---|---|---|---|
| JP | 5-251391 A | | 9/1993 |
| JP | 7-245195 A | | 9/1995 |
| JP | 8-83695 A | | 3/1996 |
| JP | 9-55372 A | | 2/1997 |
| JP | 09055372 A | * | 2/1997 |
| JP | 9-106899 A | | 4/1997 |
| JP | 2002-217119 A | | 8/2002 |
| JP | 2002-260899 A | | 9/2002 |
| JP | 2002-280378 A | | 9/2002 |
| WO | WO-2000/58995 A | | 10/2000 |
| WO | 01/19144 A1 | | 3/2001 |
| WO | WO 2004056159 A1 | * | 7/2004 |

* cited by examiner

SUBSTRATE PROCESSING APPARATUS AND SEMICONDUCTOR DEVICE PRODUCING METHOD

FIELD OF THE INVENTION

The present invention relates to a substrate processing apparatus and a semiconductor device producing method, and more particularly, to a substrate processing apparatus and a semiconductor device producing method for etching a surface of a substrate such as a silicon wafer, and forming a thin film on the surface of the substrate utilizing plasma.

DESCRIPTION OF RELATED ART

Figure 1:
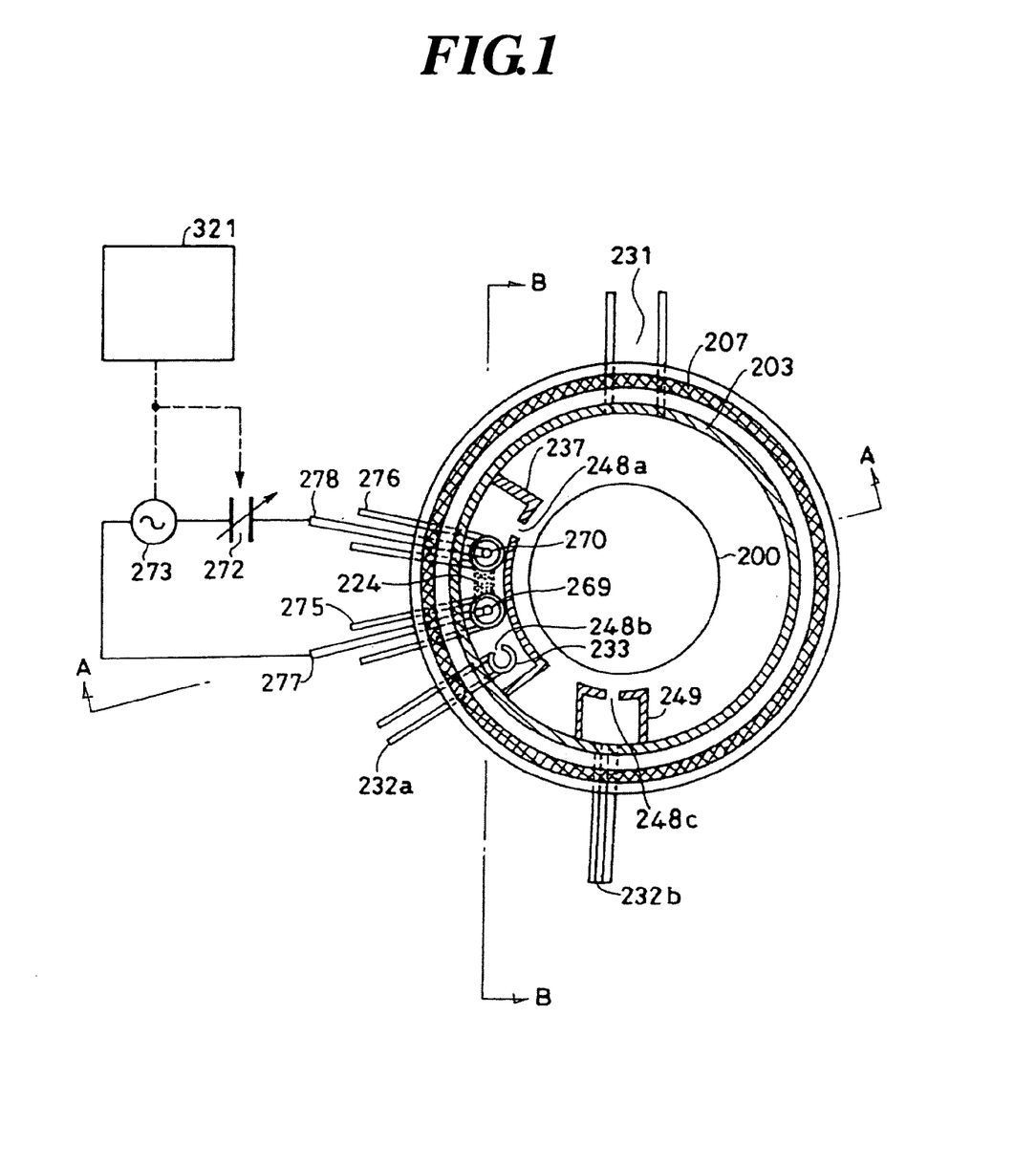
FIG. 1 is a schematic transverse sectional view for explaining a vertical substrate processing furnace of a conventional substrate processing apparatus.
Figure 2:
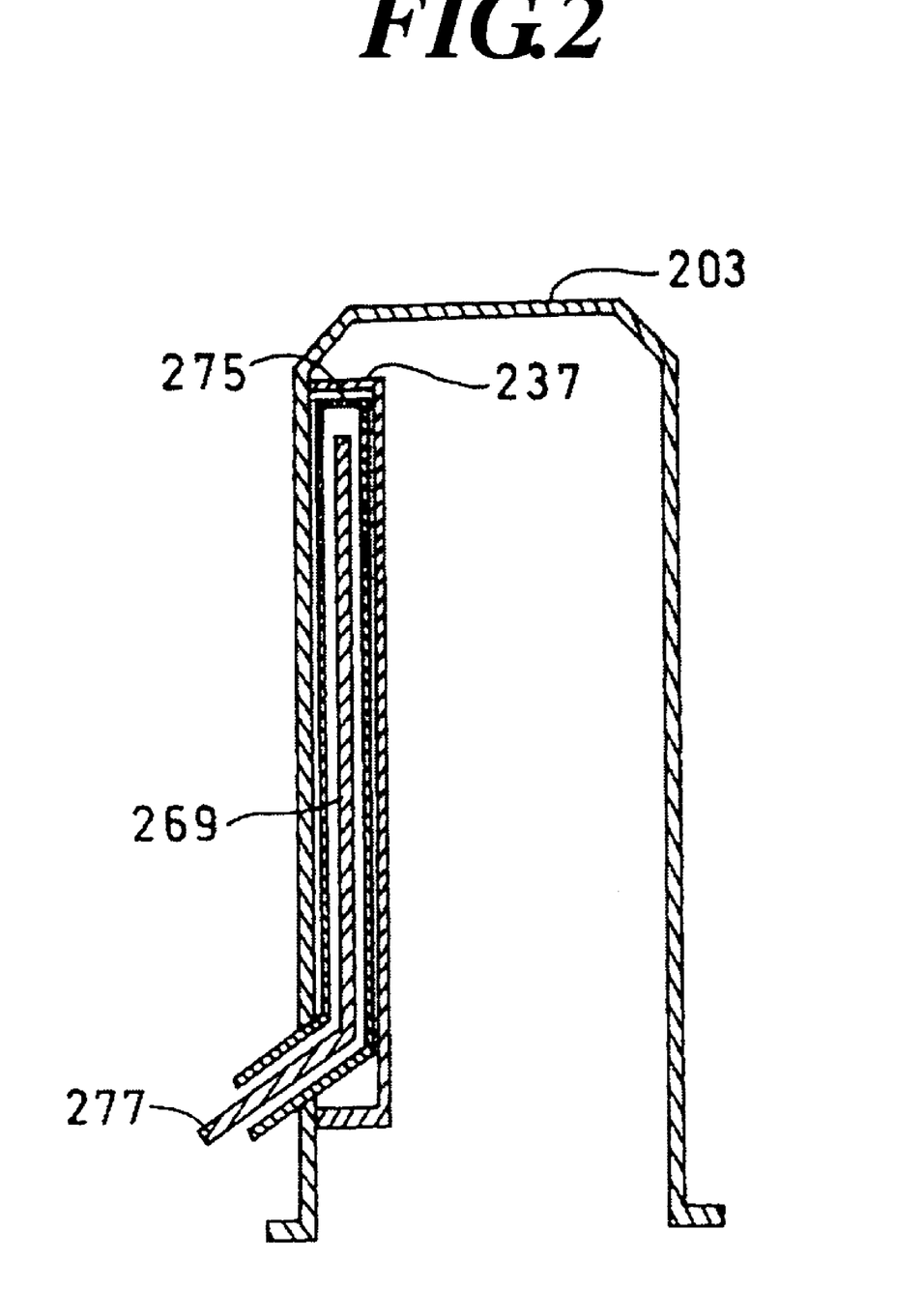
FIG. 2 is a schematic vertical sectional view taken along the line A-A in FIG. 1.
Figure 3:
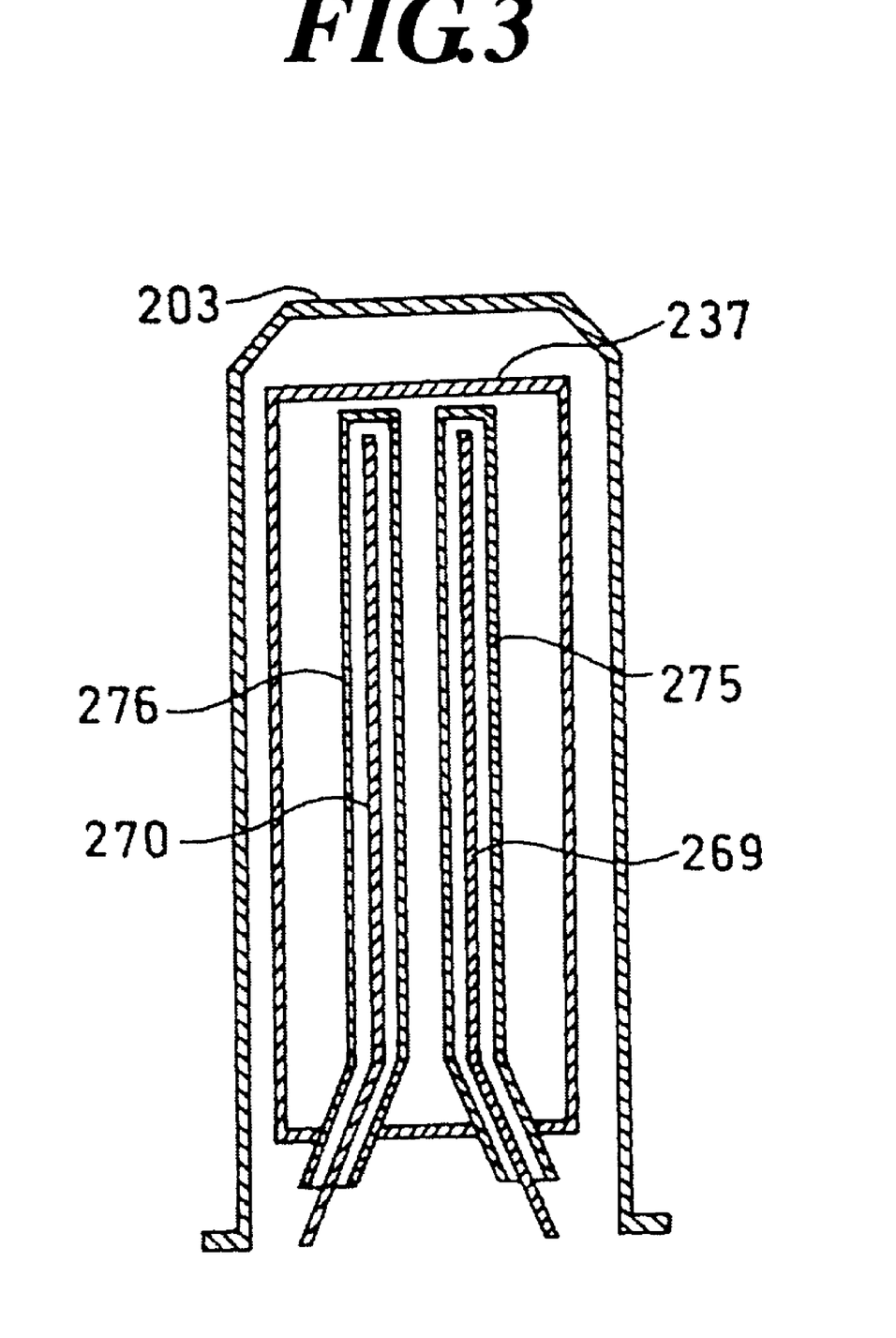
FIG. 3 is a schematic vertical sectional view taken along the line B-B in FIG. 1.

FIGS. 1 and 2 show a substrate processing apparatus for processing a silicon wafer utilizing plasma. FIG. 1 is a schematic traverse sectional view for explaining a vertical substrate processing furnace of a conventional substrate processing apparatus. FIG. 2 is a schematic vertical sectional view taken along the line A-A in FIG. 1. FIG. 3 is a schematic vertical sectional view taken along the line B-B in FIG. 1.

A thin and long buffer chamber 237 is vertically provided in the reaction tube 203 near a wall surface of the reaction tube 203. Rod-like discharging electrodes 269 and 270 respectively covered with two electrode protection tubes 275 and 276 comprising dielectrics and a gas nozzle 233 for obtaining uniform gas flow in the buffer chamber 237 are disposed in the buffer chamber 237.

High frequency electric power generated by an oscillator of a high frequency power supply 273 is applied to an end 277 of the discharging electrode 269 and an end 278 of the discharging electrode 270. Plasma 224 is generated between the discharging electrodes 269 and 270 in the buffer chamber 237. Reaction gas supplied from a gas nozzle 233 is excited with plasma. The excited active species is supplied to a wafer 200 which is a to-be processed substrate in the reaction tube 203 through a gas supply hole 248a formed in a sidewall of the buffer chamber 237.

However, this conventional discharging method is capacitively-coupled plasma, and if electric power of the oscillator is increased to increase the density of plasma, plasma merely spreads outside the buffer chamber 237 due to floating capacitance of the discharging electrodes 269 and 270, and an amount of active species is not increased.

SUMMARY OF THE INVENTION

Therefore, it is a main object of the present invention to provide a substrate processing apparatus and a semiconductor device producing method capable of increasing the amount of active species produced by plasma.

According to one aspect of the present invention, there is provided a substrate processing apparatus, comprising:
a processing container;
a gas supply section to supply a desired processing gas to the processing container;
a gas exhaust section to exhaust a surplus of the processing gas from the processing container;
a substrate placing member to place a plurality of substrates thereon in a stacked state in the processing container; and
an electrode, to which high frequency electric power is applied, to generate plasma for exciting the processing gas, the electrode including two thin and long linear sections disposed in parallel and a short-circuit section to electrically short-circuit one ends of the linear sections, and the linear sections extending beside the substrates in a direction perpendicular to main faces of the substrates.

According to another aspect of the present invention, there is provided a producing method of a semiconductor device, comprising:
providing a substrate processing apparatus, including:
a processing container;
a gas supply section to supply a desired processing gas to the processing container;
a gas exhaust section to exhaust a surplus of the processing gas from the processing container;
a substrate placing member to place a plurality of substrates thereon in a stacked state in the processing container; and
an electrode, to which high frequency electric power is applied, to generate plasma for exciting the processing gas, wherein
the electrode includes:
two thin and long linear sections disposed in parallel; and
a short-circuit section to electrically short-circuit one ends of the linear sections, wherein
the linear sections extend beside the substrates in a direction substantially perpendicular to main faces of the substrates,
placing the plurality of the substrates on the substrate placing member in the processing container in a stacked state; and
processing the substrates by supplying the desired processing gas to the processing container by the gas supply section, and generating plasma by applying the high frequency electric power to the electrode.

According to another aspect of the present invention, there is provided a producing method of a semiconductor device, comprising:
carrying a substrate placing member, on which a plurality of substrates are placed in a stacked state, into a processing container;
supplying a desired processing gas to the processing container;
exhausting a surplus of the processing gas from the processing container;
generating plasma for exciting the processing gas; and
supplying the processing gas excited by the plasma to the substrates, wherein
the generating plasma is performed by applying a high frequency electric power to an electrode, the electrode including two thin and long linear sections disposed in parallel and a short-circuit section to electrically short-circuit one ends of the linear sections, and the linear sections extending beside the substrates in a direction substantially perpendicular to main faces of the substrates.

DESCRIPTION OF THE PREFERRED EMBODIMENTS

Next, a preferred embodiment of the present invention will be explained.

A substrate processing apparatus according to a preferred embodiment of the present invention includes a vertical processing chamber for processing stacked substrates, a gas supply system for supplying a processing gas to the substrates, and a buffer chamber for once accumulating the gas to be supplied to the substrates from the gas supply system and for uniformly supplying the gas to the stacked substrates. The substrate processing apparatus generates plasma to produce electrically neutral active species and processes a plurality of substrates collectively.

A thin and long conductive U-shaped electrode is covered with a dielectric U-shaped tube and disposed in the buffer chamber as a plasma generating source. High frequency electric power is applied from an end of the thin and long conductive U-shaped electrode, thereby plasma is generated in a space inside the dielectric U-shaped tube.

Tip ends of two electrodes disposed in parallel to each other as discharging electrodes are connected to each other and a U-shaped coil of one turn is formed. With this, the plasma becomes inductive-coupled plasma which is induced by high frequency current flowing through the discharging electrodes, and a plasma generating portion is limited to a magnetic portion caused by high frequency current. Since magnetic field caused by high frequency current flowing through the two parallel discharging electrodes in opposite directions locally exists around the electrodes, the plasma generating portion is also limited around the electrodes, and plasma density can effectively be increased.

Next, the preferred embodiment of the present invention will be explained in more detail with reference to the drawings.

First, a film forming processing using an ALD (Atomic Layer Deposition) method carried out in this embodiment will be explained briefly.

In the ALD method, two (or more) kinds of raw gases used for forming films are supplied onto substrates alternately one kind by one kind under given film forming conditions (temperature, time and the like), the gas is absorbed one atomic layer by one atomic layer, and films are formed utilizing surface reaction.

That is, when forming SiN (silicon nitride) film in the ALD method, a high quality film can be formed at a low temperature of 300 to 600° C. using DCS ($SiH_2Cl_2$, dichlorosilane) and $NH_3$ (ammonia) by utilized chemical reaction. A plurality of kinds of reaction gases are supplied alternately one kind by one kind. A film thickness is controlled by the number of cycles of reaction gas supply (e.g., when film forming speed is 1 Å per cycle, in order to form a film of 20 Å, 20 cycles of the processing are carried).

Figure 4:
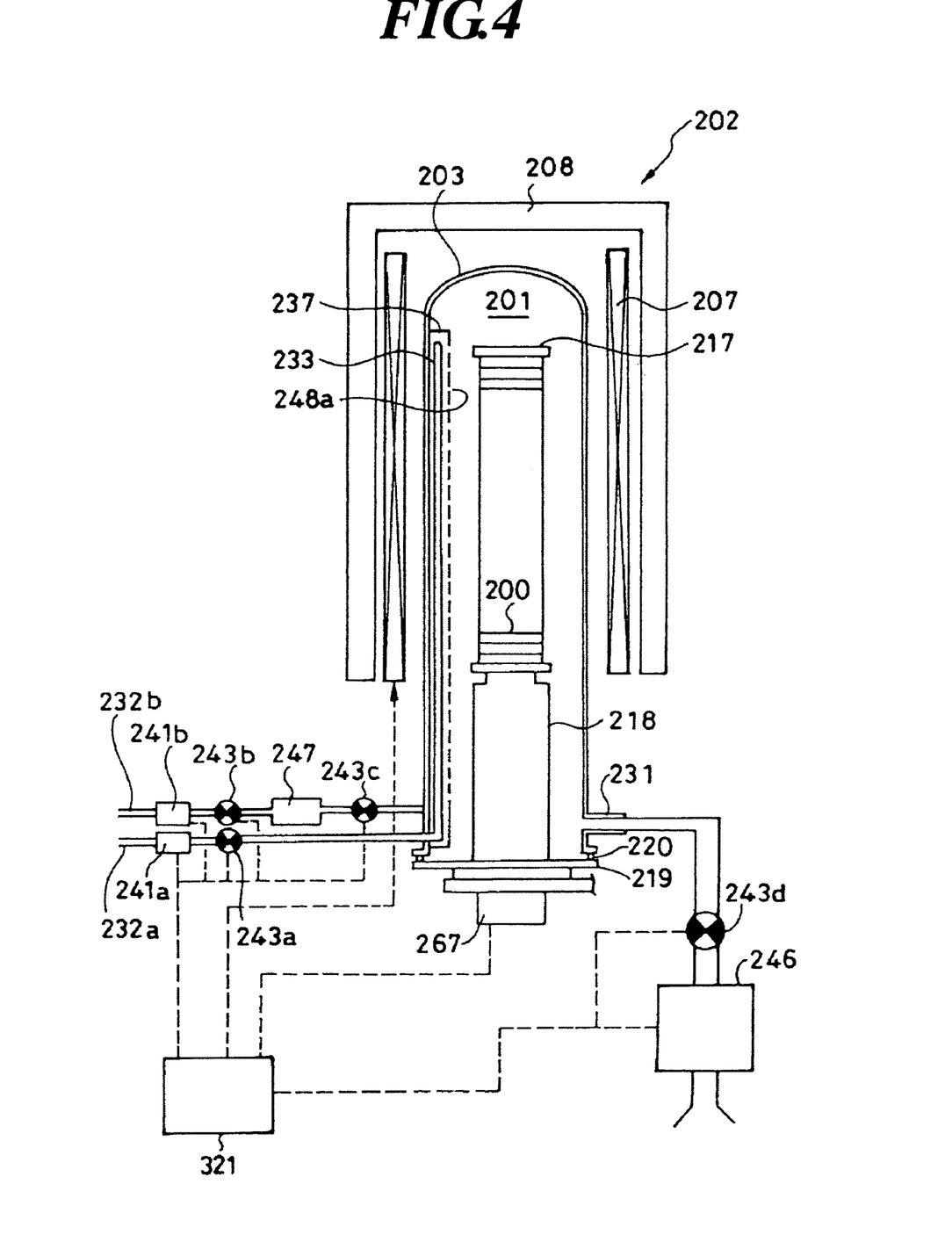
FIG. 4 is a schematic vertical sectional view for explaining a vertical substrate processing furnace of a substrate processing apparatus according to a preferred embodiment of the present invention.
Figure 5:
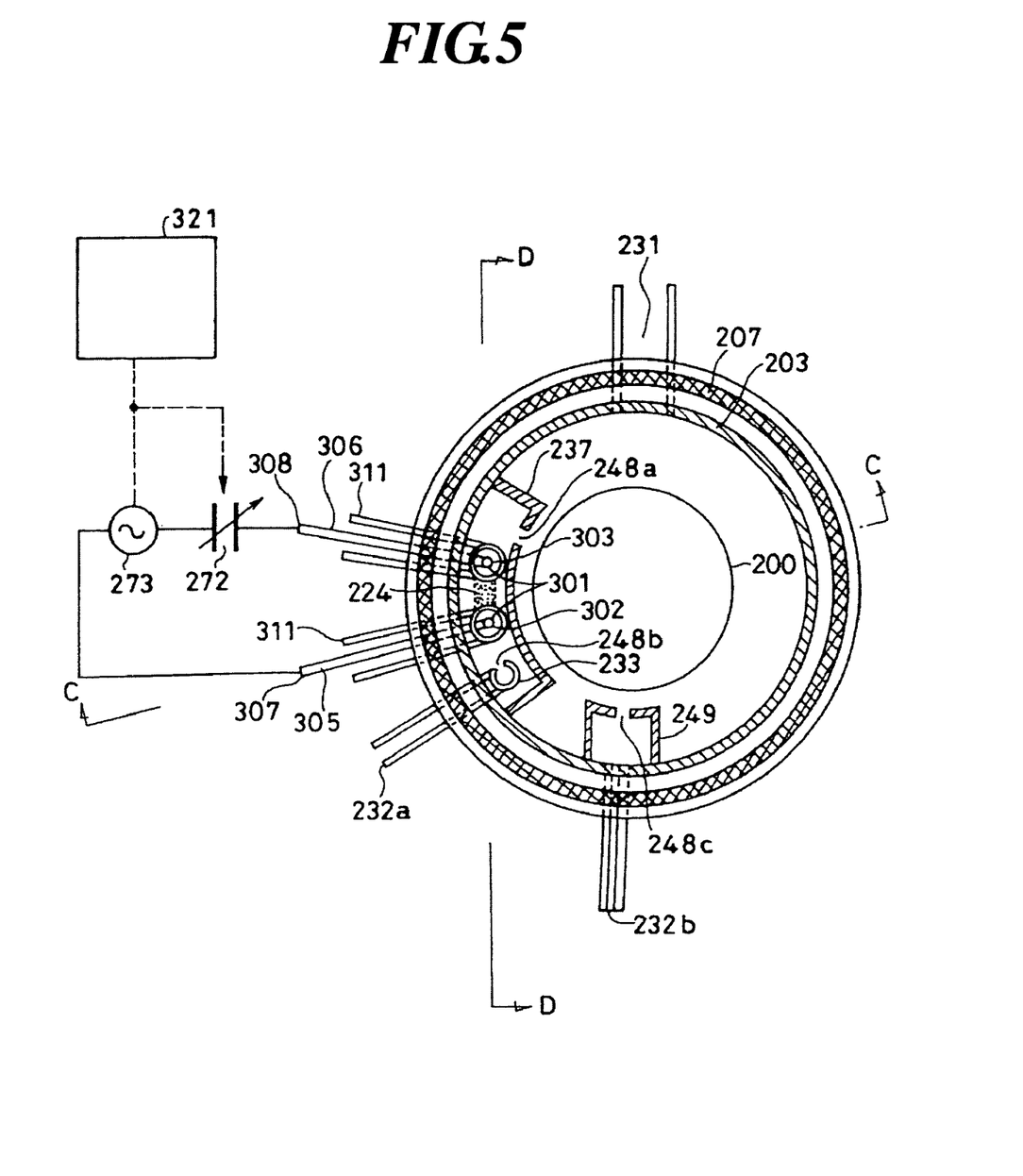
FIG. 5 is a schematic transverse sectional view for explaining a vertical substrate processing furnace of the substrate processing apparatus according to the preferred embodiment of the present invention.
Figure 6:
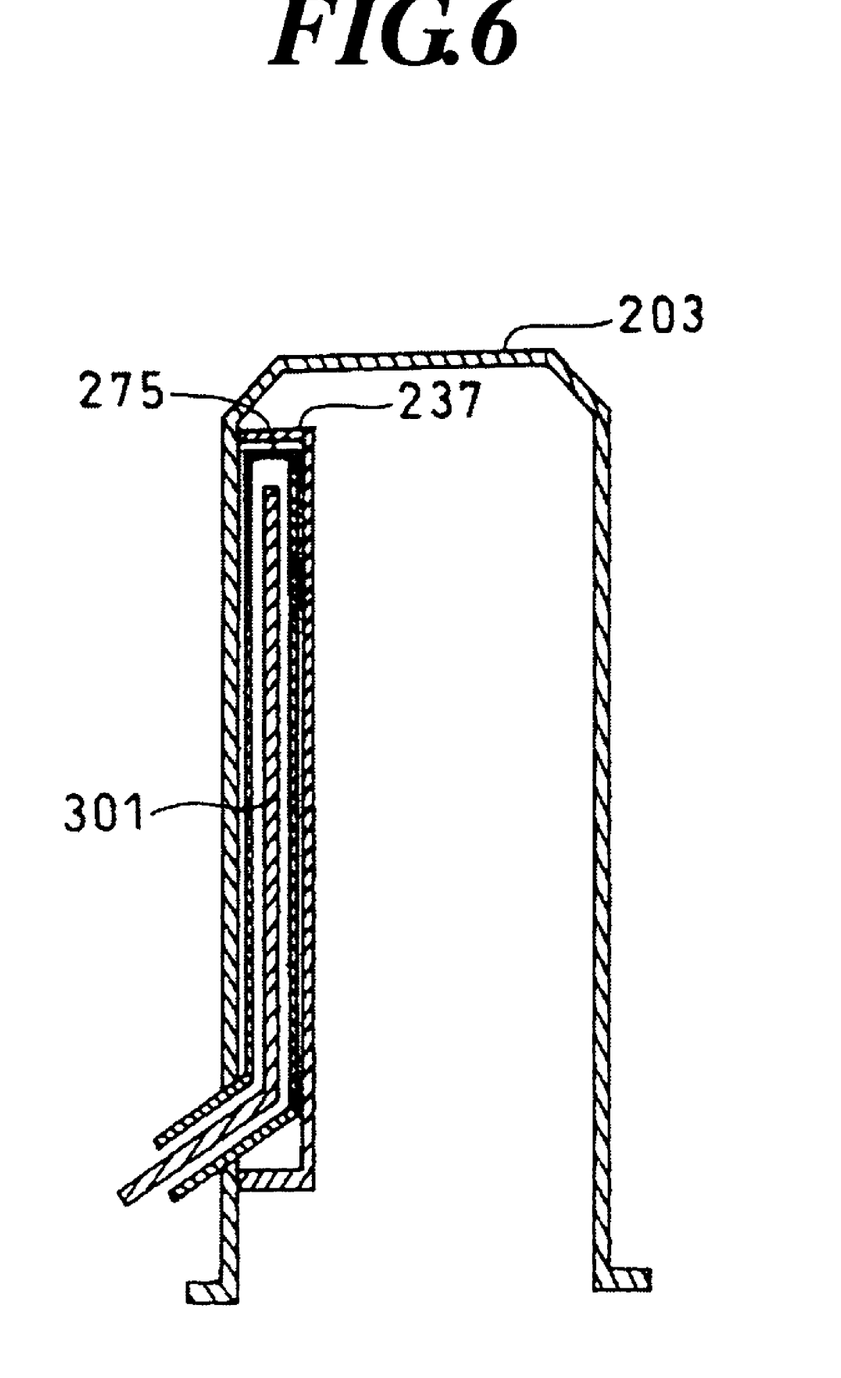
FIG. 6 is a schematic vertical sectional view taken along the line C-C in FIG. 5.
Figure 7:
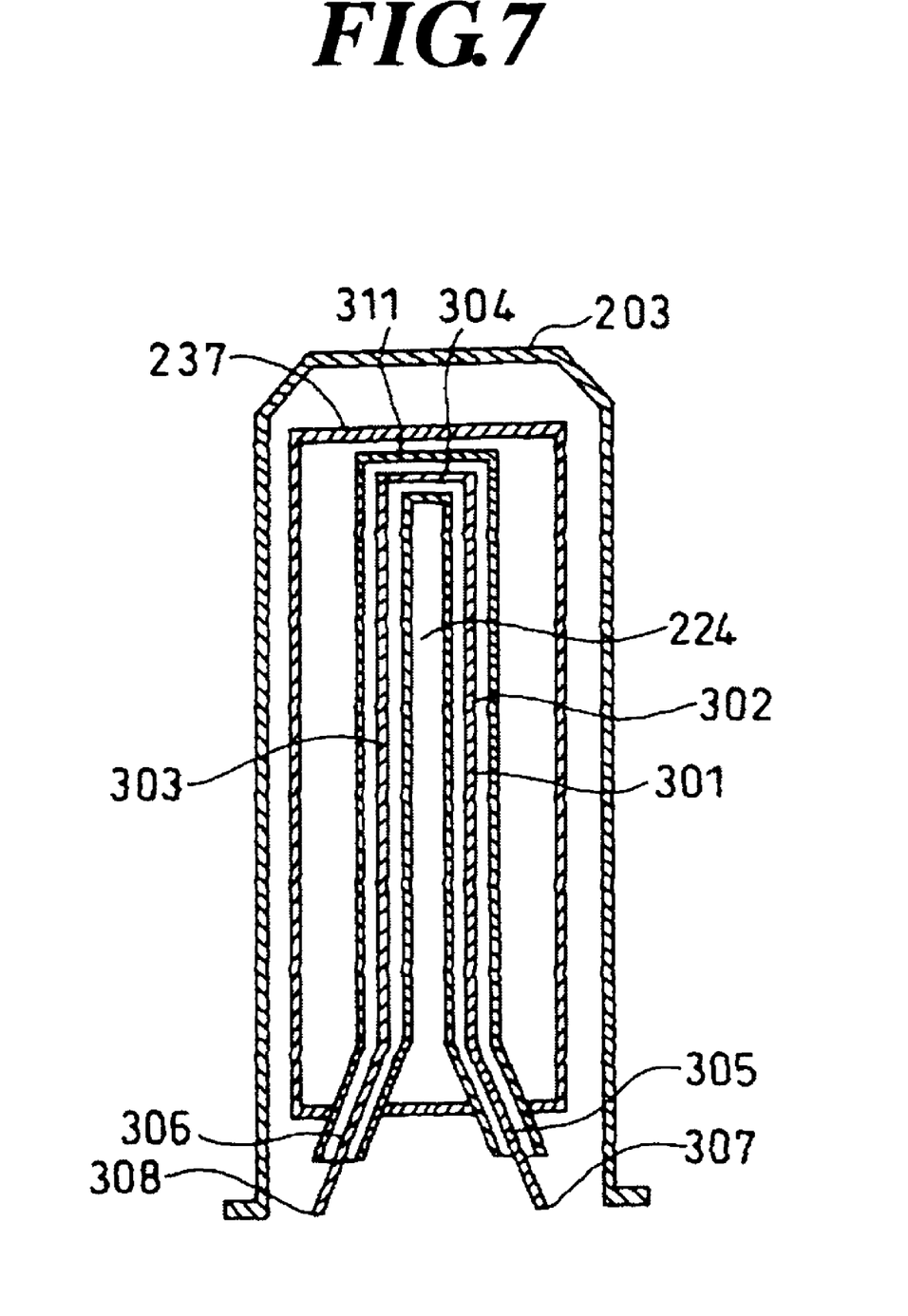
FIG. 7 is a schematic vertical sectional view taken along the line D-D in FIG. 5.

FIG. 4 is a schematic view for explaining a vertical substrate processing furnace of the embodiment, and shows the processing furnace portion in vertical sectional view. FIG. 5 is a schematic view for explaining the vertical substrate processing furnace of the embodiment, and shows the processing furnace portion in transverse sectional view. FIG. 6 is a schematic vertical sectional view taken along the line C-C in FIG. 5. FIG. 7 is a schematic vertical sectional view taken along the line D-D in FIG. 5.

A quartz reaction tube 203 as a reaction container which processes wafers 200 is provided inside a heater 207 which is heating means. The wafers 200 are substrates. A lower opening of the reaction tube 203 is air-tightly closed by a seal cap 219 through an O-ring 220. The seal cap 219 is a lid body, and the O-ring 220 is a hermetic member. A thermal insulation member 208 is provided outside the reaction tube 203 and the heater 207. The thermal insulation member 208 is provided such as to cover an upper end of the heater 207. At least the heater 207, the thermal insulation member 208, the reaction tube 203 and the seal cap 219 constitute the processing furnace 202. At least the reaction tube 203 and the seal cap 219 constitute the processing chamber 201. A boat 217 which is substrate hold means stands on the seal cap 219 through a quartz cap 218. The quartz cap 218 is a hold body which holds the boat 217. The boat 217 is inserted into the processing furnace 202. The plurality of wafers 200, which are to be processed at a time, are stacked in multi-layers in the vertical direction in an axial direction of the boat 217 in their horizontal attitudes. The heater 207 heats the wafers 200 inserted into the processing furnace 202 to a predetermined temperature.

Two gas supply sections 232a and 232b are provided as supply tubes through which a plurality of (two, in this embodiment) kinds of gases are supplied to the processing furnace 202. Here, a reaction gas is supplied from the gas supply section 232a to the processing chamber 201 through a mass flow controller 241a which is flow rate control means, a valve 243a which is an on-off valve, and a buffer chamber 237 formed in the later-described reaction tube 203. Further, a reaction gas is supplied from the gas supply section 232b to the processing chamber 201 through a mass flow controller 241b which is flow rate control means, a valve 243b which is an on-off valve, a gas holder 247, a valve 243c which is an on-off valve, and a later-described gas supply section 249.

Tube heaters (not shown) capable of heating up to about 120° C. are mounted on the two gas supply sections 232a and 232b to prevent adhesion of $NH_4Cl$ which is a reaction by-product.

The processing chamber 201 is connected to a vacuum pump 246 which is exhaust means by a gas exhaust tube 231, which is an exhaust tube through which gas is exhausted, through a valve 243d so that the processing chamber 201 is evacuated. The processing chamber 201 can be evacuated and the evacuation can be stopped by opening and closing the valve 243d. The valve 243d is an on-off valve capable of regulating pressure by adjusting a valve-opening degree.

The buffer chamber 237, which is a gas dispersion space, is provided to an inner wall of the reaction tube 203 extending from a lower portion to an upper portion of the reaction tube 203 and in an arc-shaped space between the wafers 200 and the inner wall of the reaction tube 203 constituting the processing chamber 201 along a stacking direction of the wafers 200. Gas supply holes 248a are formed near an end portion of an inner wall of the buffer chamber 237 which is adjacent to the wafers 200. The gas supply holes 248a are supply holes through which gas is supplied. The gas supply holes 248a are opened toward a center of the reaction tube 203. The gas supply holes 248a respectively have the same opening areas extending from a lower portion to an upper portion along the stacking direction of the wafers 200, and the gas supply holes 248a are formed with the same opening pitches.

A nozzle 233 is provided near an end portion of the buffer chamber 237 opposite to the end portion the gas supply holes 248a are provided. The nozzle 233 is provided along a stacking direction of the wafers 200 extending from the lower portion to the upper portion of the reaction tube 203. The nozzle 233 is provided with a plurality of gas supply holes 248b which are supply holes through which gas is supplied. The plurality of gas supply holes 248b are disposed along the stacking direction of the wafers 200 over the same predetermined length as that of the gas supply holes 248a. The plurality of gas supply holes 248b and the plurality of gas supply holes 248a correspond to each other in a one-to-one relationship.

When a pressure difference between the buffer chamber 237 and the processing furnace 202 is small, opening areas of the gas supply holes 248b are preferably the same respectively from upstream side to downstream side and the opening pitches are the same from upstream side to downstream side. However, when the pressure difference is big, it is preferable that the opening areas are increased or the opening pitches are reduced from the upstream side toward the downstream side.

By adjusting the opening areas and the opening pitches of the gas supply holes 248b from the upstream side toward the downstream side, gas flow rates ejected from the gas supply holes 248b are substantially equal, though flow velocities of the gas ejected from the gas supply holes 248b are different to each other. The gas ejected from the gas supply holes 248b is injected into the buffer chamber 237 and once introduced, and the difference of the flow velocities of the gas can be equalized.

That is, particle velocity of the gas ejected from each of the gas supply holes 248b is moderated in the buffer chamber 237 and then, the gas is injected from each of the gas supply holes 248a into the processing chamber 201. During that time, the gases ejected from the gas supply holes 248b have equal flow rates and flow velocities when the gas is ejected from the gas supply holes 248a.

A U-shaped discharging electrode 301 is disposed in the buffer chamber 237. The discharging electrode 301 is covered with a U-shaped electrode protection tube (an electrode accommodating tube) 311 which protects the discharging electrode 301. The electrode protection tube 311 comprises a dielectric. The discharging electrode includes two linear sections 302 and 303 disposed in parallel to each other, a short-circuit section 304, and derivation sections 305 and 306. The linear sections 302 and 303 are disposed such as to extend in the vertical direction. The short-circuit section 304 is disposed such as to short-circuit between upper ends of the linear sections 302 and 303. Derivation sections 307 and 308 are connected to lower ends of the linear sections 302 and 303, respectively. The linear sections 302 and 303 extend beside the wafers 200 in a direction perpendicular to main faces of the wafers 200.

The electrode protection tube 311 has such a structure that it can be inserted into the buffer chamber 237 in a state where the discharging electrode 301 is isolated from an atmosphere in the buffer chamber 237. If an atmosphere in the electrode protection tube 311 is the same as outside air (atmosphere), the discharging electrode 301 inserted into the electrode protection tube 311 is heated by the heater 207 and oxidized. Hence, an inert gas purging mechanism (not shown) is provided for filling the electrode protection tube 311 with inert gas such as oxygen or carrying out gas purge in the electrode protection tube 311, thereby suppressing the oxygen concentration to sufficient low level and preventing the discharging electrode 301 from being oxidized. The electrode protection tube 311 is fixed to the reaction tube 203.

One end 307 of the discharging electrode 301 is connected to a high frequency power supply 273 through a matching device 272, and the other end 308 thereof is connected to earth ground which provides a reference potential.

When high frequency electric power generated in the high frequency power supply 273 is applied to the discharging electrode 301, plasma is generated in a plasma generating region 224 of a space between the linear sections 302 and 303 covered by the electrode protection tube 311, the gas supplied from each of the gas supply holes 248b of the nozzle 233 is excited, and the excited species are supplied to the wafers 200 in the reaction tube 203 through the gas supply holes 248a formed in the sidewall of the buffer chamber 237.

The linear sections 302 and 303 of the discharging electrode 301 are disposed in parallel to each other, and one ends of the linear sections 302 and 303 are short-circuited. Accordingly high frequency current flows through the linear sections 302 and 303 in directions opposite to each other. As a result, a magnetic field caused by the high frequency current is abruptly attenuated outside the two linear sections 302 and 303 as moving away from the linear sections 302 and 303. The generated magnetic fields locally exist inside between the linear sections 302 and 303. As a result, high density plasma which locally exists inside between the linear sections 302 and 303 can be obtained. A shape between the linear sections 302 and 303 is linear and the linear sections 302 and 303 are disposed in parallel to each other. Therefore, the plasma density in the extending direction of the linear sections 302 and 303 is constant. Thus, it is possible to carry out uniform processing between the wafers 200 which are stacked in the extending direction of the linear sections 302 and 303.

The plasma is inductive-coupled plasma which is induced by high frequency current flowing through the discharging electrode 301, and locations where the plasma is generated are limited to magnetic fields caused by the high frequency current. The magnetic fields caused by high frequency current flowing through the parallel two linear sections 302 and 303 in directions opposite to each other locally exist around the linear sections 302 and 303. Therefore, the plasma is also limited to locations around the linear sections 302 and 303, and the density of plasma can effectively be increased.

Figure 8:
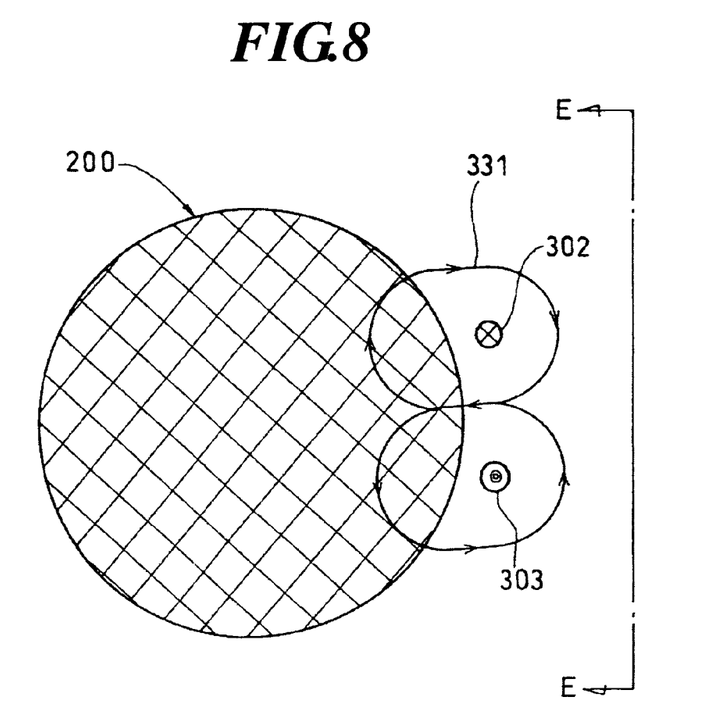
FIG. 8 is a schematic transverse sectional view for explaining an effect of the vertical substrate processing furnace of the substrate processing apparatus according to the preferred embodiment of the present invention.
Figure 9:
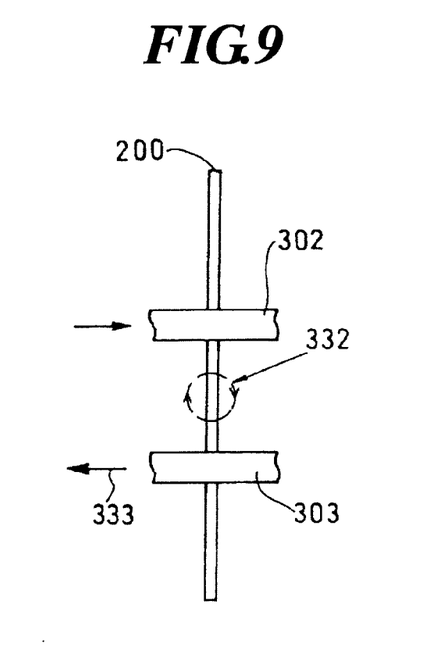
FIG. 9 is a schematic diagram taken along the line E-E in FIG. 8.

In this embodiment, the linear sections 302 and 303 are disposed beside the wafers 200 in a direction perpendicular to main faces of the wafers 200. Referring to FIGS. 8 and 9, high frequency current 333 flows through the linear sections 302 and 303 which are inductive-coupled electrodes, and magnetic fields 331 are generated around the linear sections 302 and 303 concentrically. Since the linear sections 302 and 303 are disposed in the direction perpendicular to the main faces of the wafers 200, the generated magnetic fields 331 do not penetrate the wafers 200, eddy current 332 which affects the wafers is not generated, and the wafers 200 are not damaged.

Figure 10:
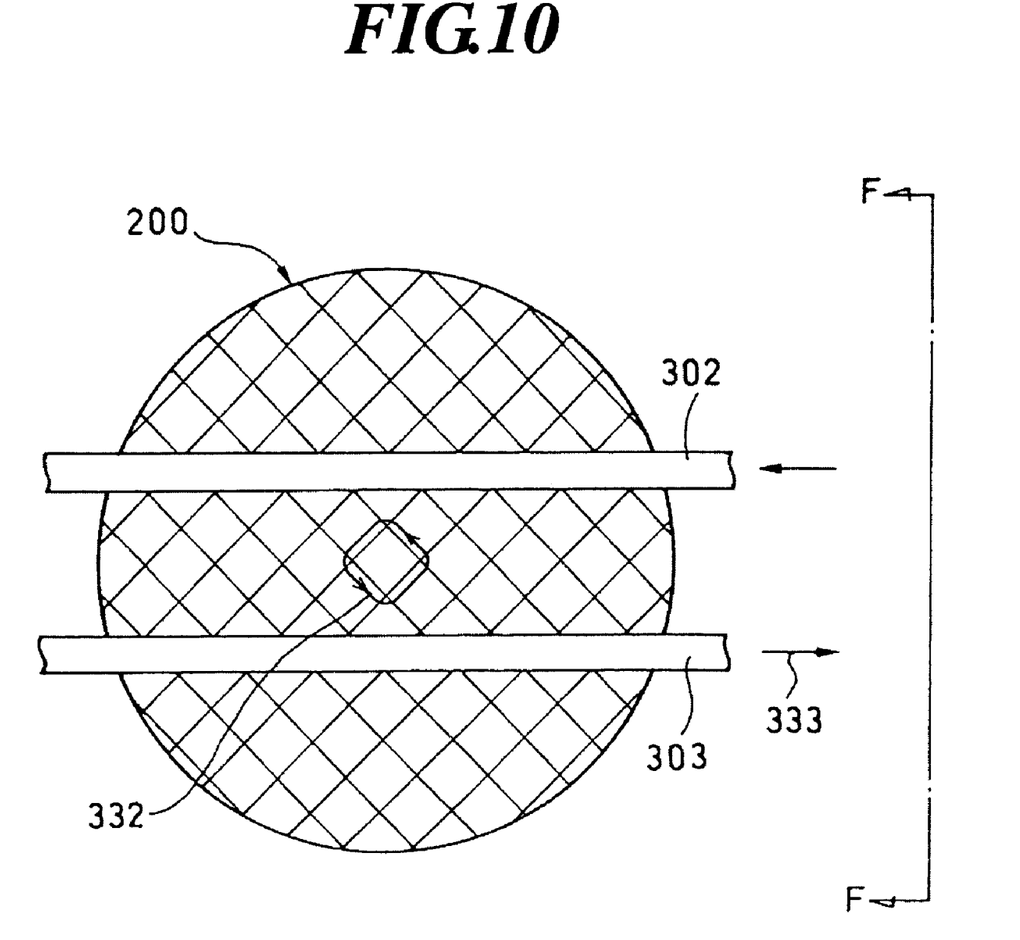
FIG. 10 is a schematic transverse sectional view for explaining an effect of a substrate processing furnace for comparison.
Figure 11:
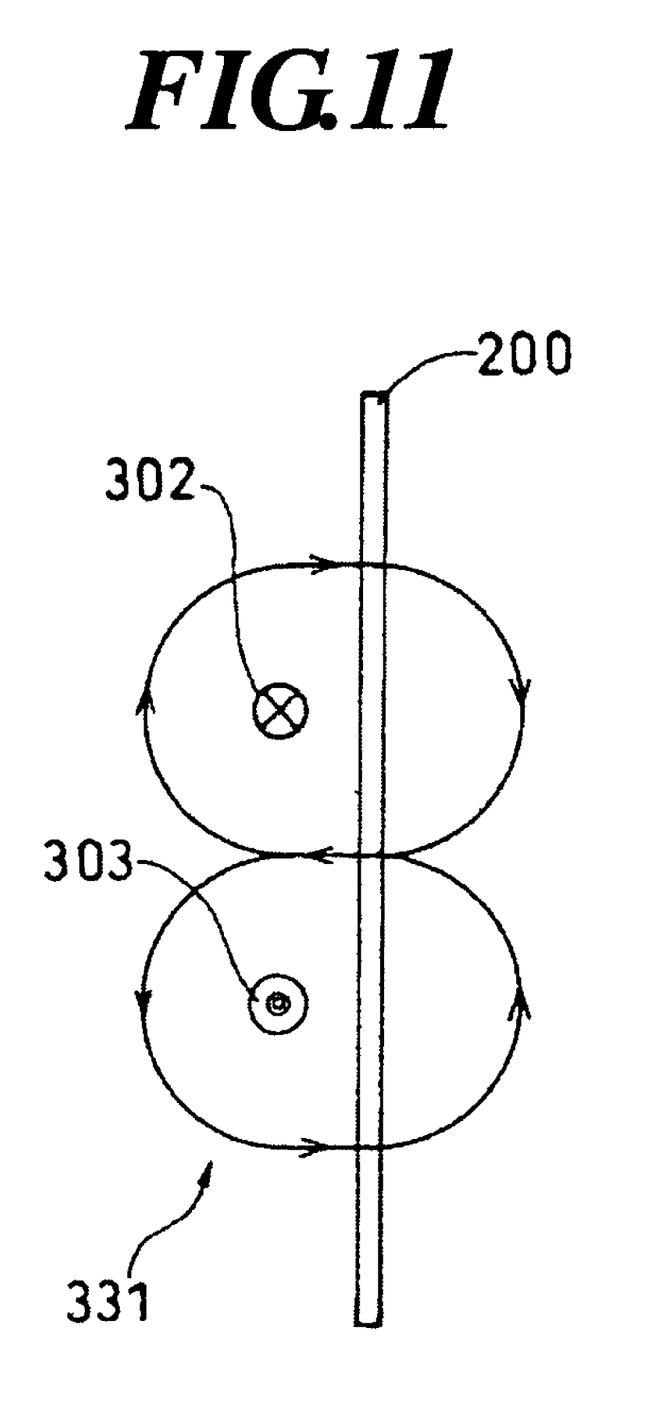
FIG. 11 is a schematic diagram taken along the line F-F in FIG. 10.

On the other hand, when the linear sections 302 and 303 are disposed in parallel to the main faces of the wafers 200, as shown in FIGS. 10 and 11, high frequency current 333 flows through the linear sections 302 and 303 which are inductive-coupled electrodes located at an upper portion of the wafer 200, and magnetic fields 331 are generated around the linear sections 302 and 303 concentrically. Since the linear sections 302 and 303 are disposed in parallel to the main faces of the wafers 200, the generated magnetic fields 331 penetrate the wafers 200. The magnetic fields 331 which penetrate the wafers 200 generate eddy current 332 on surfaces of the wafers 200. The high frequency eddy current 332 is concentrated on a surface of a conductor, and a film formed on the surface of each wafer 200 is damaged. Further, a pattern constituting a circuit is usually formed on the surface of the wafer 200, the high frequency eddy current 332 flows through the circuit pattern. As a result, an active element connected to the pattern is destroyed in some cases.

A gas supply section 249 is provided to an inner wall of the reaction tube 203 away from the gas supply holes 248a by 120 degrees along an inner periphery of the reaction tube 203. The gas supply section 249 is a supply section which shares gas supply kinds with the buffer chamber 237 when a plurality of kinds of gases are supplied alternately one kind by one kind.

The gas supply section 249 includes gas supply holes 248c which are supply holes through which gas is supplied like the buffer chamber 237. The gas supply holes 248c are formed at locations adjacent to the wafers with the same pitches. A gas supply section 232b is connected to a lower portion of the gas supply section 249.

When a pressure difference between the buffer chamber 237 and the processing furnace 201 is small, opening areas of the gas supply holes 248c are preferably the same from upstream side to downstream side and the opening pitches are the same from the upstream side to the downstream side, but when the pressure difference is big, it is preferable that the opening areas are increased or the opening pitches are reduced from the upstream side to the downstream side The boat 217 is provided at a central portion in the reaction tube 203. The plurality of wafers 200 are placed on the boat 217 at the same distances from one another in the vertical direction. The boat 217 can be brought into and out from the reaction tube 203 by a boat elevator mechanism (not shown). To enhance the uniformity of the processing, a boat rotating mechanism as rotating means is provided to rotate the boat 217. By rotating the boat rotating mechanism 267, the boat 217 held by the quartz cap 218 is rotated.

A controller 321 as control means is connected to the mass flow controllers 241a and 241b, the valves 243a, 243b, 243c and 243d, the heater 207, the vacuum pump 246, the boat rotating mechanism 267, a boat elevator 121, the high frequency power supply 273, and the matching device 272. The controller 321 carries out adjustment of flow rates of the mass flow controllers 241a and 241b, opening and closing operations of the valve 243a, 243b, 243c, opening and closing operation and adjustment of pressure of the valve 243d, opening and closing operation and adjustment of pressure of a regulator 302, adjustment of temperature of the heater 207, actuation and stop of the vacuum pump 246, adjustment of rotation speed of the boat rotating mechanism 267, control of vertical movement of the boat elevator 121, control of supply of electric power of the high frequency power supply 273, and impedance control by the matching device 272.

Next, an example for forming an SiN film using DCS and NH$_3$ gases using the ALD method will be explained as an example for forming a film.

First, wafers 200 on which films are to be formed are set on the boat 217, and the boat 217 is brought into the processing furnace 202. Thereafter, the following three steps are executed sequentially.

[Step 1]

In step 1, NH$_3$ gas which must be plasma-excited and DCS gas which need not be plasma-excited flow concurrently. Both the valve 243a provided in the gas supply section 232a and the valve 243d provided in the gas exhaust tube 231 are opened, NH$_3$ gas whose flow rate is adjusted by the mass flow controller 241a is injected from the gas supply section 232a into the buffer chamber 237 through the gas supply holes 248b of the nozzle 233, high frequency electric power is applied to the discharging electrode 301 from the high frequency power supply 273 through the matching device 272 to plasma-excite the NH$_3$ gas, the NH$_3$ gas is supplied to the processing chamber 201 as the active species and is exhausted from the gas exhaust tube 231. When the NH$_3$ gas is plasma-excited and allowed to flow as the active species, the valve 243d is appropriately adjusted and the internal pressure in the processing chamber 201 is set to 10 to 100 Pa. A supply flow rate of NH$_3$ gas which is controlled by the mass flow controller 241a is 1000 to 10000 sccm. Time during which the wafers 200 are exposed to the active species obtained by plasma-exciting the NH$_3$ gas is 2 to 120 seconds. The temperature of the heater 207 is set such that the temperature of the wafer becomes 500 to 600° C. Since the reaction temperature of the NH$_3$ gas is high, the NH$_3$ gas does not react at the wafer temperature. Thus, the NH$_3$ gas is allowed to flow as the active species by plasma-exciting the NH$_3$ gas. Therefore, this can be carried out in the set low temperature range of the wafer.

When the NH$_3$ gas is plasma-excited and is supplied as the active species, the upstream side valve 243b of the gas supply section 232b is opened and the downstream side valve 243c is closed so that DCS gas can also flow. With this, the DCS gas is stored in the gas holder 247 provided between the valves 243b and 243c. At that time, gas flowing into the processing chamber 201 is the active species obtained by plasma-exciting the NH$_3$ gas, and DCS gas does not exist. Therefore, the NH$_3$ gas does not cause vapor-phase reaction, and the NH$_3$ gas, which is plasma-excited and becomes active species, surface-reacts with a foundation film on the wafer 200.

[Step 2]

In step 2, the valve 243a of the gas supply section 232a is closed and supply of NH$_3$ gas is stopped, but supply to the gas holder 247 is continued. If a predetermined amount DCS gas having a predetermined pressure is stored in the gas holder 247, the upstream side valve 243b is also closed, and the DCS gas is trapped in the gas holder 247. The valve 243d of the gas exhaust tube 231 remains open, gas is exhausted from the processing chamber 201 by the vacuum pump 246 so that the pressure of the processing chamber 201 becomes 20 Pa or lower, and remaining NH$_3$ gas is exhausted from the processing chamber 201. If inert gas such as N$_2$ is supplied to the processing chamber 201 at that time, the eliminating effect of remaining NH$_3$ gas is enhanced. The DCS gas is stored in the gas holder 247 such that the pressure of the holder 247 becomes 20000 Pa or higher. The apparatus is constituted such that the conductance between the gas holder 247 and the processing chamber 201 becomes $1.5 \times 10^{-3}$ m$^3$/s or higher. When considering a ratio between a cubic capacity of the reaction tube 203 and a cubic capacity of the gas holder 247 which is necessary for this, if the cubic capacity of the reaction tube 203 is 100l (liters), it is preferable that the cubic capacity of the gas holder 247 is 100 to 300 cc, this is, the cubic capacity of the gas holder 247 is 1/1000 to 3/1000 times of that of the reaction tube 203.

[Step 3]

In step 3, if the exhausting operation in the processing chamber 201 is completed, the valve 243d of the gas exhaust tube 231 is closed to stop the exhausting operation. The downstream side valve 243c of the gas supply section 232b is opened. With this, the DCS gas stored in the gas holder 247 is supplied to the processing chamber 201 at a dash. At that time, since the valve 243d of the gas exhaust tube 231 is closed, the pressure in the processing chamber 201 is abruptly increased to about 931 Pa (7 Torr). Time during which the DCS gas is supplied is set to 2 to 4 seconds, time during which the wafers 200 are exposed to the increased pressure atmosphere is set to 2 to 4 seconds, and total time is set to 6 seconds. The temperature of the wafers at that time is the same as the temperature when the $NH_3$ gas is supplied, and is 500 to 600° C. If the DCS gas is supplied, the $NH_3$ gas on the foundation film and the DCS gas surface-react with each other, and an SiN film is formed on the wafers 200. After the film is formed, the valve 243c is closed, the valve 243d is opened, the processing chamber 201 is evacuated, and the remaining DCS gas which is contributed to the film formation is exhausted. At that time, if inert gas such as $N_2$ is supplied to the processing chamber 201, the effect of eliminating the remaining DCS gas which is contributed to the film formation from the processing chamber 201 is enhanced. The valve 243b is opened, and supply of DCS gas to the gas holder 247 is started.

The above steps 1 to 3 are defined as one cycle. By repeating this cycle a plurality of times, an SiN film having a predetermined thickness is formed on wafers.

In the ALD apparatus, gas is absorbed to the foundation film surface. The amount of adsorption of gas is proportional to gas pressure and gas exposure time. Therefore, in order to absorb a desired given amount of gas within a short time, it is necessary to increase the gas pressure within a short time. In this embodiment, the valve 243d is closed and the DCS gas stored in the gas holder 247 is instantaneously supplied. Therefore, it is possible to abruptly increase the pressure of the DCS gas in the processing chamber 201, and it is possible to instantaneously absorb a desired given amount of gas.

In this embodiment, while the DCS gas is stored in the gas holder 247, the $NH_3$ gas is plasma-excited and supplied as the active species, and the gas is exhausted from the processing chamber 201 as a necessary step in the ALD method. Therefore, a special step for storing the DCS gas is not required. The processing chamber 201 is evacuated, the $NH_3$ gas is eliminated and then the DCS gas flows. Thus, both the gases do not react with each other on the way to the wafers 200. The supplied DCS gas can effectively react only with the $NH_3$ gas absorbed to the wafers 200.

Figure 12:
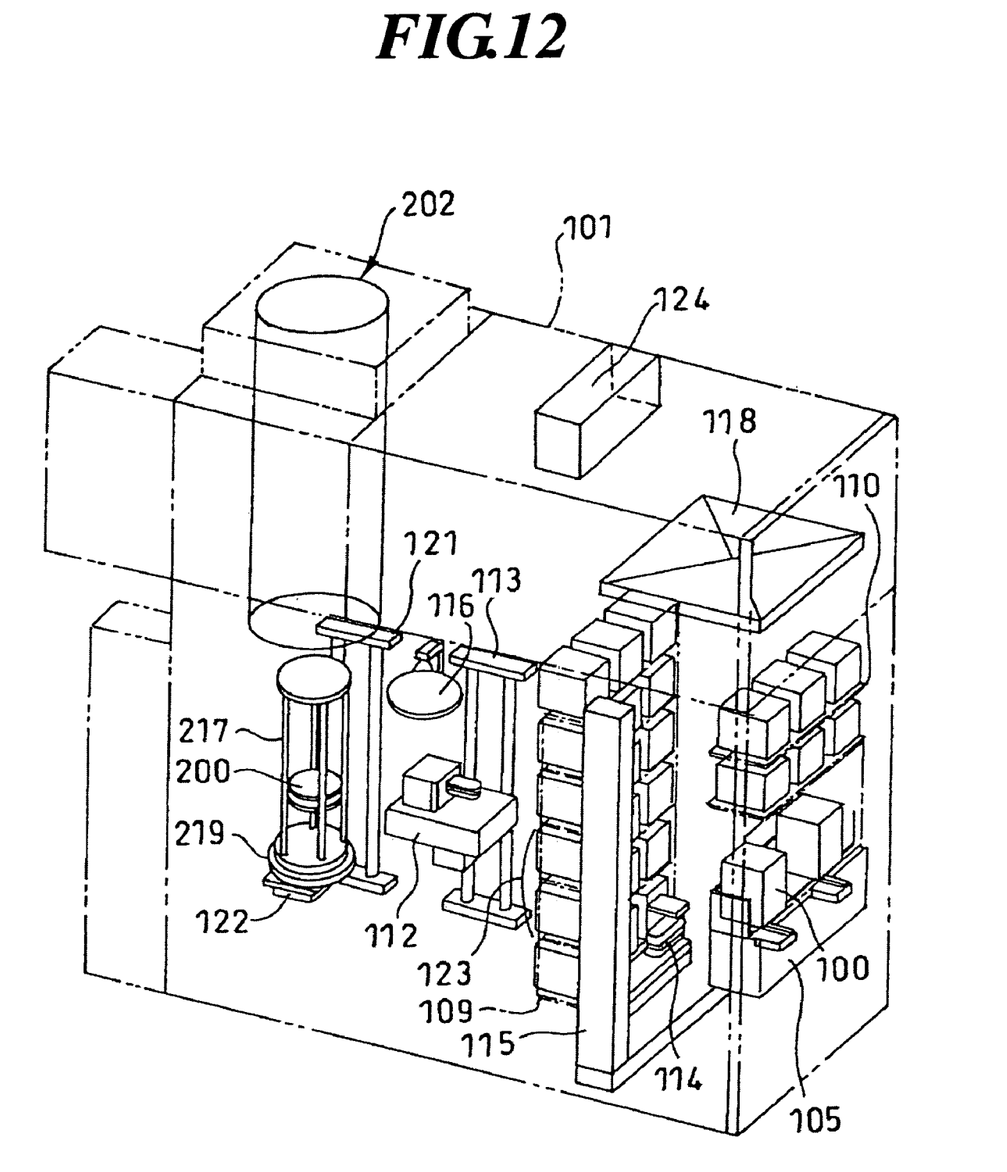
FIG. 12 is a schematic perspective view for explaining a substrate processing apparatus according to a preferred embodiment of the present invention.
Figure 13:
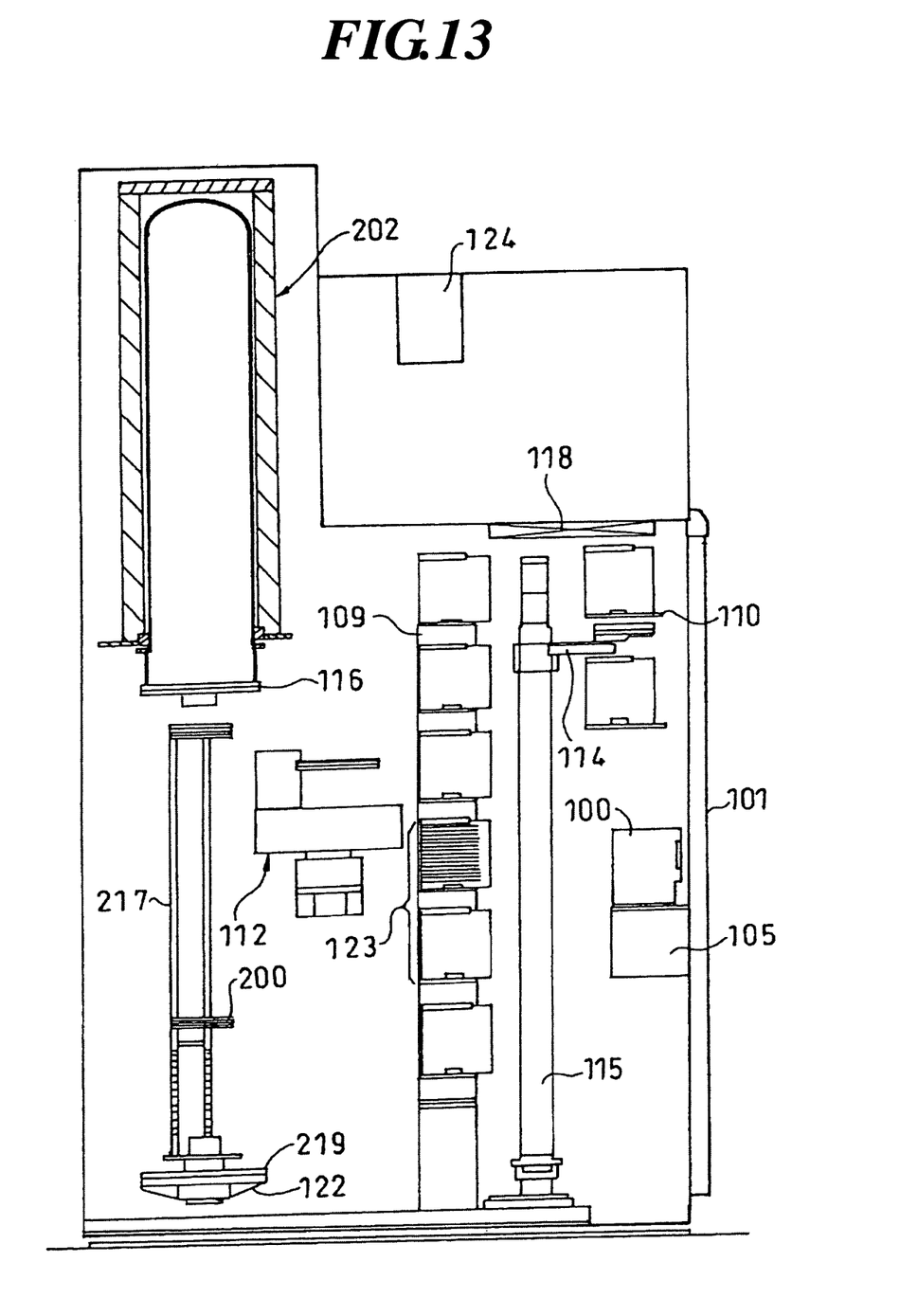
FIG. 13 is a schematic vertical sectional view for explaining a substrate processing apparatus according to a preferred embodiment of the present invention.

Next, an outline of the substrate processing apparatus of the embodiment will be explained with reference to FIGS. 12 and 13.

A cassette stage 105 as a holder delivery member for giving and receiving cassettes 100 as an accommodation container between an external transfer device (not shown) is provided in the casing 101 on the front surface side. A cassette elevator 115 as elevator means is provided behind the cassette stage 105. A cassette moving machine 114 as transfer means is mounted on the cassette elevator 115. Cassette shelves 109 as mounting means of the cassettes 100 are provided behind the cassette elevator 115. Auxiliary cassette shelves 110 are provided above the cassette stage 105. A clean unit 118 is provided above the auxiliary cassette shelves 110 so that clean air flows through the casing 101.

A processing furnace 202 is provided above a rear portion of the casing 101. A boat elevator 121 as elevator means is provided below the processing furnace 202. The boat elevator 121 vertically moves the boat 217 as substrate holding means which hold wafers 200 as substrates in horizontal attitude in multistage manner. A seal cap 219 as a lid is mounted on a tip end of an elevator member 122 mounted on the boat elevator 121, and the seal cap 219 vertically supports the boat 217. A transfer elevator 113 as elevator means is provided between the boat elevator 121 and the cassette shelves 109. A wafer moving machine 112 as transfer means is mounted on the transfer elevator 113. A furnace opening shutter 116 as closing means for air-tightly closing a lower side of the processing furnace 202 is provided beside the boat elevator 121. The furnace opening shutter 116 has an opening/closing mechanism.

The cassettes 100 into which wafers 200 are loaded are carried onto the cassette stage 105 from the external transfer device (not shown) in such an attitude that the wafers 200 are oriented upward, and the cassettes 100 are rotated 90 degrees on the cassette stage 105 such that the wafers 200 are in the horizontal attitudes. The cassettes 100 are transferred from the cassette stage 105 to the cassette shelves 109 or the auxiliary cassette shelves 110 in cooperation with vertical motion and lateral motion of the cassette elevator 115 and forward and backward motion and rotation of the cassette moving machine 114.

Transfer shelves 123 in which cassettes 100 to be transferred by the wafer moving machine 112 are included in the cassette shelves 109. The cassette 100, which contains the wafers 200 to be transferred, is transferred to the transfer shelf 123 by the cassette elevator 115 and the cassette moving machine 114.

When the cassette 100 is transferred to the transfer shelf 123, the wafers 200 are transferred to the boat 217, which is in the lowered state, from the transfer shelf 123 in cooperation with forward and backward motion and rotation of the wafer moving machine and vertical motion of the transfer elevator 113.

When a predetermined number of wafers 200 are transferred to the boat 217, the boat 217 is inserted into the processing furnace 202 by the boat elevator 121, and the processing furnace 202 is air-tightly closed by the seal cap 219. The wafers 200 are heated in the air-tightly closed processing furnace 202, processing gas is supplied into the processing furnace 202 and the wafers 200 are processed.

When the processing of the wafers 200 is completed, the wafers 200 are transferred to the cassettes 100 on the transfer shelves 123 from the boat 217 in the reverse procedure to the above-described procedure, the cassettes are transferred from the transfer shelves 123 to the cassette stage 105 by the cassette moving machine 114, and are transferred out from the casing 101 by the external transfer device (not shown). When the boat 217 is lowered, the furnace opening shutter 116 air-tightly closes the lower surface of the processing furnace 202 so as to prevent outside air from being mixed into the processing furnace 202.

The transfer operation of the cassette moving machine 114 is controlled by transfer operation control means 124.

The entire disclosures of Japanese Patent Application No. 2005-056314 filed on Mar. 1, 2005 including specification, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

As explained above, according to the preferred embodiment of the present invention, it is possible to increase the amount of active species produced by plasma.

As a result, the present invention can preferably be utilized for a substrate processing apparatus which processes a semiconductor wafer, and for a producing method of a semiconductor device.

The invention claimed is:

1. A substrate processing apparatus, comprising:
    a processing container having a substantially cylindrical shape;
    a gas supply section to supply a desired processing gas to the processing container;
    a gas exhaust section to exhaust a surplus of the processing gas from the processing container;
    a substrate placing member to place a plurality of substrates thereon in a stacked state and in horizontal attitudes thereof in the processing container;
    a substrate placing member rotating mechanism to rotate the substrate placing member; and
    an electrode, to which high frequency electric power is applied, to generate plasma for exciting the processing gas, the electrode being arranged at a position different from the gas exhaust section when viewed from above of the processing container, the electrode including two thin and long linear sections disposed in parallel and a short-circuit section to electrically short-circuit one ends of the linear sections, and the linear sections being provided at a portion of an inner face of the processing container and extending beside the substrate placing member in a substantially vertical direction.

2. The substrate processing apparatus according to claim 1, wherein
    the short-circuit section and at least portions of the two linear sections of the electrode are disposed in the processing container,
    the substrate processing apparatus further comprises an accommodating tube to air-tightly accommodate, with respect to the processing container, the electrode disposed in the processing container,
    the accommodating tube accommodates the linear sections such that a portion of a space between the two linear sections is in communication with an atmosphere in the processing container.

3. The substrate processing apparatus according to claim 2, wherein
    the electrode including the linear sections and the short-circuit section is formed in a U-shaped configuration, and the accommodating tube is also formed in a U-shaped configuration.

4. The substrate processing apparatus according to claim 1, wherein
    plasma is to be generated in a portion of a space between the two linear sections.

5. The substrate processing apparatus according to claim 1, wherein
    at least portions of the two linear sections of the electrode are disposed in parallel to each other.

6. The substrate processing apparatus according to claim 1, wherein
    a buffer chamber, which is a dispersion space for the processing gas, is provided to an inner wall of the processing container and in a space between the inner wall of the processing container and peripheral edges of the substrates along a stacking direction of the substrates,
    the short-circuit section and at least portions of the two linear sections of the electrode are disposed in the buffer chamber, and
    plasma is to be generated in the buffer chamber.

* * * * *